United States Patent [19]
Tani et al.

[11] Patent Number: 5,252,435
[45] Date of Patent: Oct. 12, 1993

[54] METHOD FOR FORMING PATTERN

[75] Inventors: Yoshiyuki Tani, Neyagawa; Masaru Sasago, Hirakata, both of Japan

[73] Assignee: Matsushita Electric Industrial Co., Ltd., Kadoma, Japan

[21] Appl. No.: 646,920

[22] Filed: Jan. 28, 1991

[30] Foreign Application Priority Data

Jan. 30, 1990 [JP] Japan ............................. 2-019529
Jan. 30, 1990 [JP] Japan ............................. 2-019530

[51] Int. Cl.$^5$ .......................... G03F 7/20; G03F 7/40; G03C 5/16
[52] U.S. Cl. ..................... 430/325; 430/270; 430/322; 430/330
[58] Field of Search ............... 430/270, 322, 325, 330, 430/945

[56] References Cited

U.S. PATENT DOCUMENTS

| | | | |
|---|---|---|---|
| 4,537,854 | 8/1985 | Crivello | 430/283 |
| 4,610,952 | 9/1986 | Crivello | 430/325 |
| 4,883,740 | 11/1989 | Schwalm | 430/330 |
| 5,017,461 | 5/1991 | Abe | 430/330 |
| 5,035,979 | 7/1991 | Nguyen-Kim | 430/330 |
| 5,055,439 | 10/1991 | Allen | 502/150 |

Primary Examiner—Marion E. McCamish
Assistant Examiner—Kathleen Duda
Attorney, Agent, or Firm—Nikaido, Marmelstein, Murray & Oram

[57] ABSTRACT

A pattern with high contrast and good adhesive-ness to a substrate can be formed by forming on a substrate a film of pattern forming material comprising (a) a resin having functional groups and hydrophilic groups, (b) a photoacid generator, and (c) a solvent, exposing the film selectively to light, heating the exposed film and developing the resulting film.

6 Claims, 6 Drawing Sheets

METHOD FOR FORMING PATTERN

BACKGROUND OF THE INVENTION

This invention relates to a method for forming pattern.

Recently, with the promotion of higher density integration of semiconductor devices, the light source wavelength of an exposure device used for fine process, especially photolithography is more and more shortened. At present i-line (365 nm) has entered its practical use and KrF excimer laser (248.4 nm) is already investigated. However, resist pattern materials, especially resist materials suitable for KrF excimer laser, and deep ultraviolet wavelength ranges have not been developed sufficiently. For example, even when MP2400 (Shipley Co.) which is said to have high sensitivity and transmittance for KrF excimer laser light is used, because of the surface absorption of a novolac resin which is a base polymer and poor optical reactivity of a sensitizer, naphthoquinone diazide compound, pattern shape after pattern formation is too low in quality to be used.

Also as a pattern forming material for deep UV, there is reported a resist which contains 2-diazo-1,3-dione compound which has a high transmittance for deep UV light of around 248 nm. However, compared with the transmittance of 70% of the base polymer of the resist, the transmittance is only approx. 40%, and enough photo-bleach is not obtained. Also as a result of pattern forming experiments, it is found that the pattern has an angle of approx. 70 degrees which value is insufficient compared with a pattern shape which becomes a satisfying etching mask with a vertical shape.

Also it has become clear that the sensitivity of this pattern forming material is as low as from 140 to 150 mJ/cm$^2$. That is, the high transmittant pattern forming material containing a 2-diazo-1,3-dione compound has low sensitivity, and is difficult for a practical use when there is used KrF excimer laser light of which energy efficiency is poor.

In recent years, as a means to decrease exposure energy quantity, a material comprising poly(tertial-butoxy carbonate (t-BOC)) styrene and an onium salt was proposed. This is a chemical amplification pattern forming material which generates an acid by exposure to light, said acid acting as a catalyst. Various reports have been made recently [e.g. Polym. Eng. Sci. vol. 23, page 1012 (1983)]. A pattern forming method using such a chemical amplification pattern forming material is explained referring to FIGS. 1(a) to 1(d). The pattern forming material 12 is spin coated on a semiconductor substrate 1, and it is soft baked for 90 seconds on a hot plate of 90° C. to obtain a 1.0 μm thick pattern forming material film (FIG. 1(a)). In most cases, an insulation film, an electroconductive film and an oxide film are formed on the substrate 1. Next, an acid is generated from a photoacid generator in the material 12 as shown in the following chemical change by exposure to KrF excimer laser (248.4 nm) 4 through a mask 5 (FIG. 1(b)).

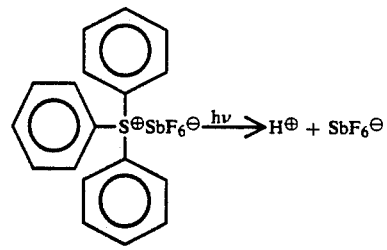

Then the chemical change mentioned below is caused by the heat treatment (post exposure bake) of the said material film on a hot plate for 90 seconds at 130° C., and the resin becomes alkali-soluble (FIG. 1(c)).

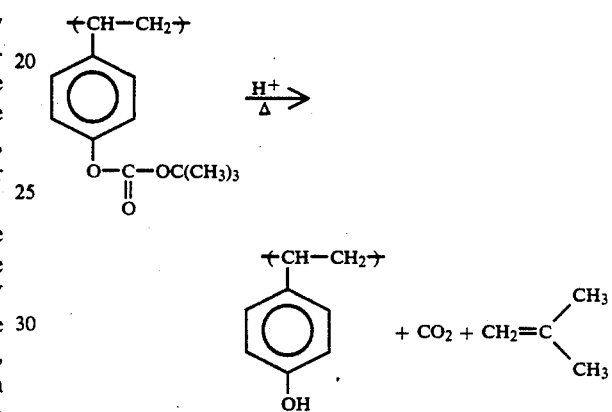

Finally, positive type pattern 12a and 12c are obtained by dissolution and removal of exposed part 12 of the pattern forming material 12 by using an alkaline developer (MF-319, mfd. by Shipley Co.) (FIG. 1(d)).

But, it was proved impossible to apply this method for forming fine pattern 12c on a substrate as shown in FIG. 1(d), if the pattern size is 1.0 μm or less, especially 0.5 μm or less. The broken line in FIG. 1(d) shows that the pattern which is to be retained is not retained. The reason why the super fine patterns are not formed is proved to be the low adhesiveness between the pattern forming material and the substrate according to the present inventors' investigation. Although this is not a problem in a device production of several μm level as in said prior art process, it is a fatal problem in the process for forming fine patterns of 1 μm or less, especially super fine patterns of 0.5 μm or less in high density. Consequently, it is impossible to produce a device of submicron rule. Thus, the reason why the super fine patterns are not formed turned out to be the low adhesiveness between the pattern forming material and the substrate. Since poly(t-BOC)styrene resin conventionally used for a pattern forming material does not contain the hydrophilic radical in its molecule, when it is made into a thin film, it becomes hydrophobic. As for the substrate, hydrophobic treatment with hexamethyldisilazane (HMDS) is applied to make the substrate surface uniform before forming the pattern forming material film. Thus the substrate surface becomes hydrophobic. It became clear by the present inventors' investigations that since the hydrophobic substrate and the hydrophobic pattern forming material have poor adhesiveness each other, when the exposed part is dissolved by a developer and removed, an unexposed part which is to be not dissolved is also removed due to pood adhesiveness, resulting in failing to form patterns on the substrate. This phenomenon becomes especially remarkable in fine patterns of 1 μm or less. Therefore, it is extremely important to prevent this in the production of super fine semiconductor integrated circuits which forms super fine patterns of 1 μm or less, especially 0.5 μm or less, with high productivity.

It has been proved that the pattern size of these chemical amplification type resists change by heating the substrate (the said PEB (post exposure bake)) to disperse the generated acid after exposure as shown in FIG. 2. For instance, the size change caused by PEB performed one hour after exposure is over 20%, and when this is applied to the production of semiconductor device of super fine rule, pattern sizes between wafers on chips becomes uneven affecting greatly on productivity, reliability and characteristics of the semiconductor elements, accordingly it is impossible to form a device as designed. The present inventors found that the reason of pattern size change is that the functional group in the resin shows alkali soluble reaction during the exposure.

Conventional poly(t-BOC)styrene resin shows the below reaction which is the same one as under acid ambience by deep ultraviolet.

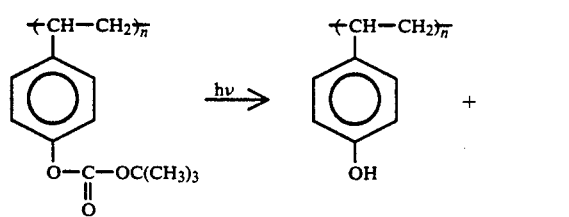

As seen above, the resin becomes to show the alkali-soluble property in this exposure process before dispersing the generated acid by exposure through the PEB process. Therefore, the pattern size changes depending on the period between the exposure and the PEB. Poly(t-BOC)-styrene has two points where the linkage is weak (shown by ↑) in the functional group.

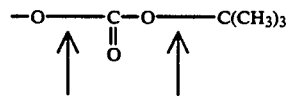

The linkages are easily cut off not only by acid ambience but also by exposure to light. That is, because the t-BOC moiety has many points where the linkage is weak, separation by exposure easily occurs. In short, this is considered to cause the size change. Consequently it is extremely important to prevent this in the production of a semiconductor integrated circuit with super fine patterns of which size allowance is small.

SUMMARY OF THE INVENTION

It is an object of this invention to provide a method for forming fine patterns with high precision in size by using a chemical amplification type pattern forming material containing a resin having functional groups having high photo stability and hydrophilic groups.

This invention relates to a resist pattern forming method used for the production of semiconductor elements and others, and to a pattern forming method to form positive type patterns using deep UV light, excimer laser of 400 nm or less, for instance, as an exposure energy source.

This invention provides a process for forming a pattern which comprises forming on a substrate a film of pattern forming material comprising (a) a resin having functional groups capable of becoming alkali-soluble under an acid atmosphere, and a moiety having a hydrophilic group, (b) a photoacid generator being able to generate an acid by exposure to light, and (c) a solvent for dissolving both the components (a) and (b), exposing the film selectively to deep ultra-violet light, heating the exposed film, and developing the resulting film to form the desired pattern.

In the above-mentioned process, it is preferable to use as the resin (a) that having the repeating units of the formula:

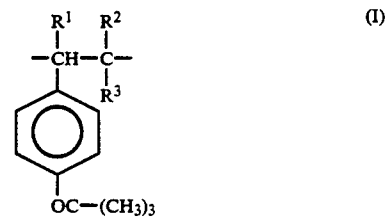

wherein $R^1$, $R^2$ and $R^3$ are independently a hydrogen atom, a halogen atom or a lower alkyl group.

DESCRIPTION OF THE PREFERRED EMBODIMENTS

Figure 1A:
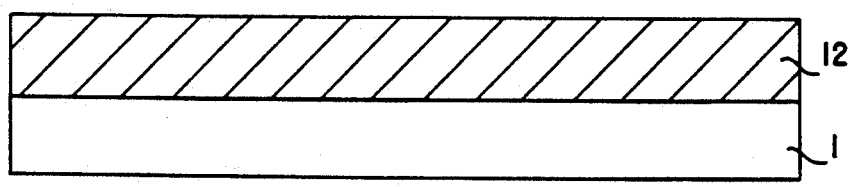
FIGS. 1(a) to 1(d) are cross-sectional views explaining the steps of a prior art pattern forming process.
Figure 1B:
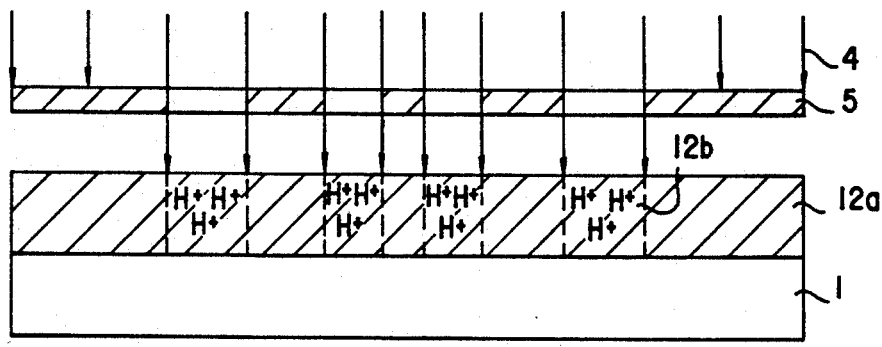
Figure 1C:
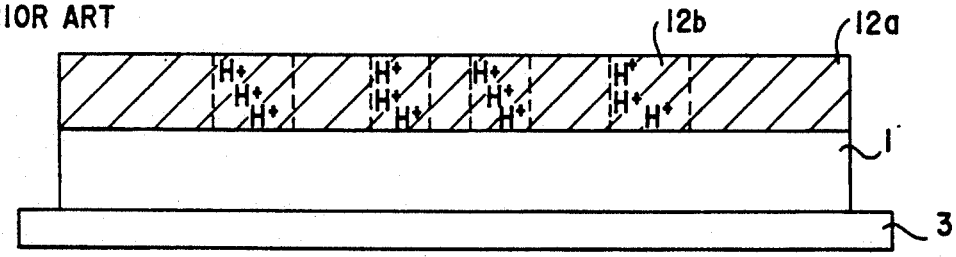
Figure 1D:
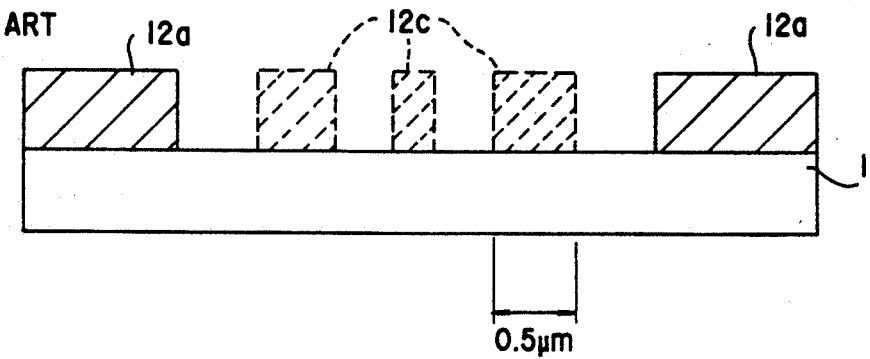
Figure 2:
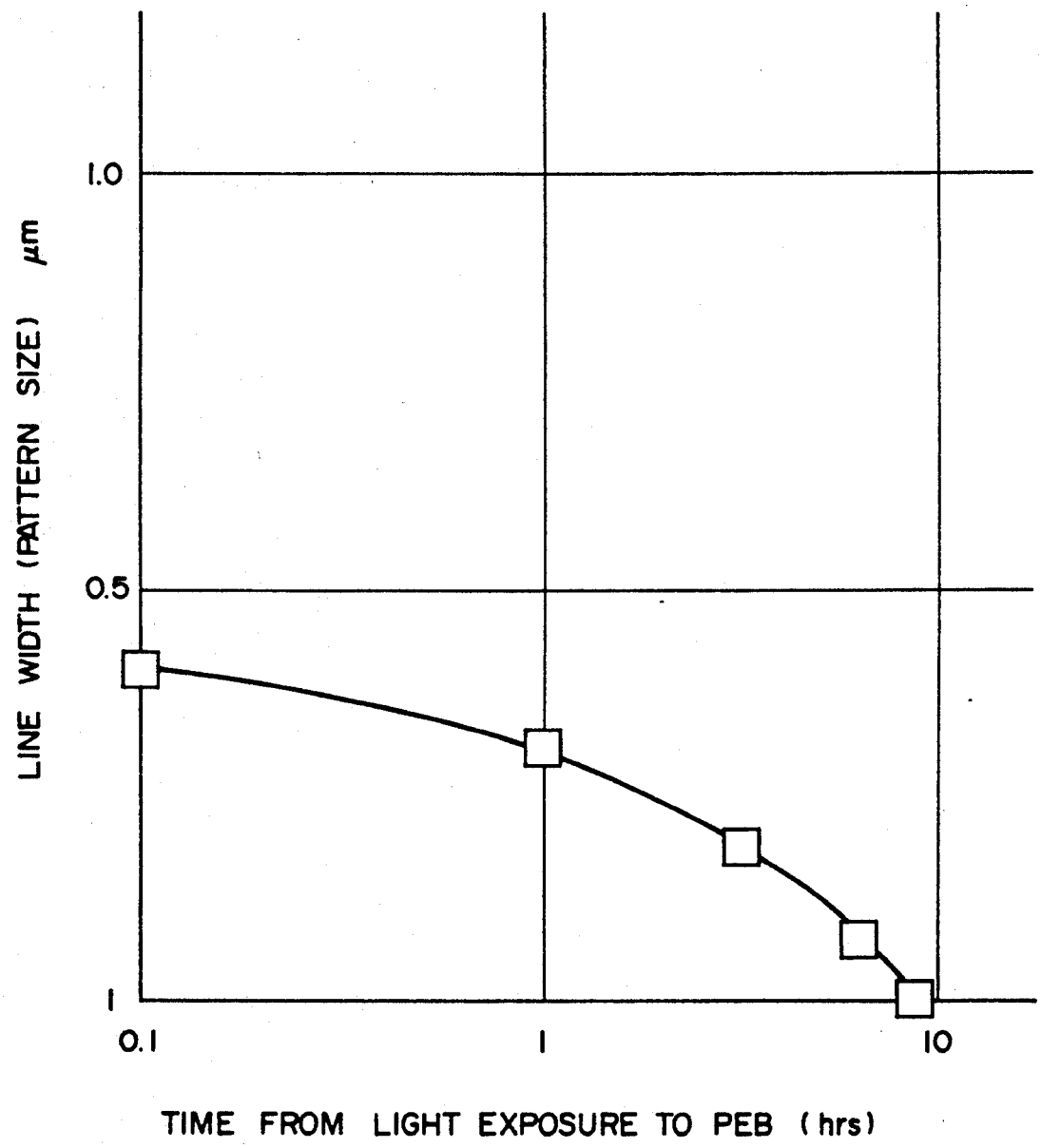
FIG. 2 shows line-width variation dependence on the time from the light exposure to PEB in a prior art pattern forming method.
Figure 3A:
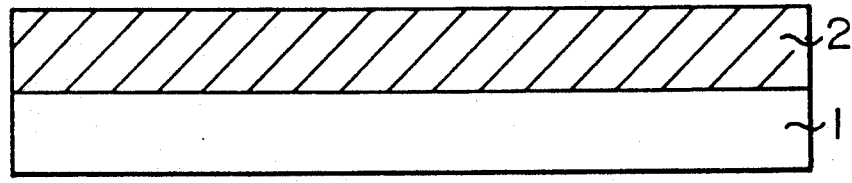
FIGS. 3(a) to 3(d) are cross-sectional views explaining the process of this invention.
Figure 3B:
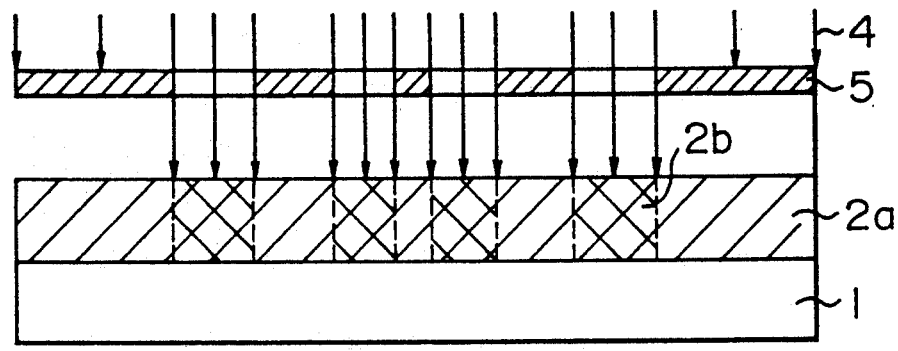
Figure 3C:
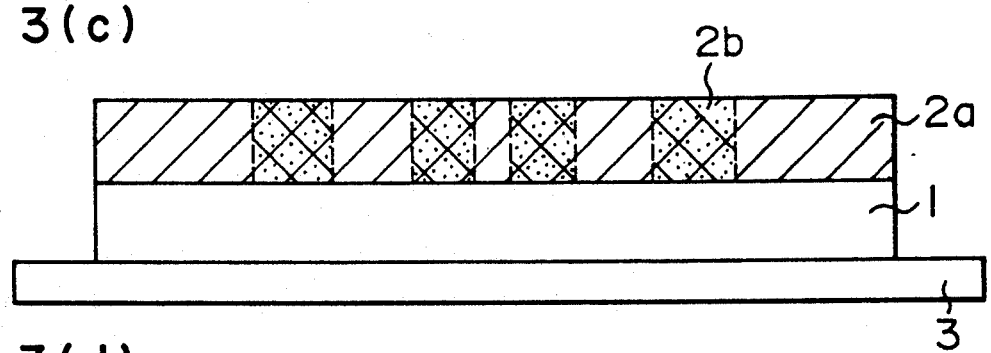
Figure 3D:
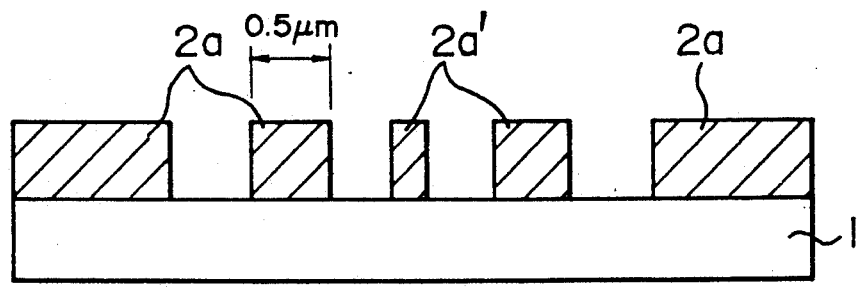

This invention is explained concretely as follows. An acid is generated from a photosensitive compound (or photoacid generator) exposed to KrF excimer laser light, deep ultraviolet light, etc. Functional groups of a resin are photochemically changed by the acid into an alkali-soluble state by the heat treatment after the exposure process and released into a developer at the time of development. On the other hand, since the acid is not generated on an unexposed part, the photochemical change does not occur during the heat treatment, resulting in not producing an alkali-soluble group. As a result, positive type patterns with good contrast can be formed by the method of this invention. Also since the acid generated by the exposure functions as a catalyst, the exposure to light is sufficient to generate only a necessary amount of acid, resulting in reducing the exposure energy. That fine patterns peel off at the time of development is a serious problem in the production of submicron rule device. In short, a pattern forming method which can form excellent shape of which patterns do not peel off is indispensable in the production of submicron device. In this invention, by adding hydrophilic ingredients to the resin, the pattern forming material which uses this resin becomes hydrophilic and improves adhesiveness to the hydrophobic substrate. That is, it is possible to form superfine patterns of 1.0 μm or less, especially 0.5 μm or less without peeling off at the time of development. The deformation of the resist pattern size depends on the time between the light exposure and PEB as mentioned above and produces an error between the size of actual patterns and that of design. Although these are not important factors in a prior art semiconductor process (rules over 1 μm), they are important factors which greatly affect the device characteristics, productivity and reliability in the super fine device forming process of 1 μm or less, especially 0.5 μm or less. The formation of resist patterns with the exact size as designed is possible in the present invention by introducing a functional group with high photosensitivity, that is, a tert-butoxy group, into the resin in the pattern forming material.

This invention provides a pattern forming method which is by far excellent in the size control property in a superfine lithographic method with high sensitivity and high contrast to deep UV lights, especially to KrF excimer laser. Further this invention is applicable to super fine device of 0.3 μm rule and so on. As a result, this invention exhibits a great industrial value in the promotion of micronization of semiconductor elements and so on, and improvement of productivity.

The resin (a) contained in the pattern forming material has functional groups capable of becoming alkali-soluble under an acid atmosphere and a moiety having a hydrophilic group.

After various investigations of ingredients with hydrophilic property, it was found that preferable groups are a hydroxyl group, a carboxyl group, a 2-hydroxycarbonyl group, a sulfonic acid group, and a group of the formula:

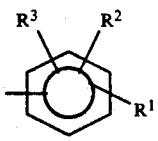

wherein, $R^1$ is a hydroxyl group, a carboxyl group, a 2-hydroxyethoxycarbonyl group; and $R^2$ and $R^3$ are independently a hydrogen atom, a halogen atom or a lower alkyl group. These groups improve hydrophilic property of the resin. Thus, a pattern forming material using such a resin obtained by copolymerizing with ingredients which have functional groups which become alkali-soluble in an acid atmosphere, has high hydrophilic property to form resist patterns which do not peel off at the time of development. The groups with hydrophilic property are not limited to what is stated above.

On the other hand, the present inventors considered that a reason for changes of the pattern dimension lies in poor photostability of the functional group of the resin as stated before, and found a method to use a pattern forming material containing a resin having functional groups showing alkali-soluble property in acid ambience with high photo stability. By introducing the functional group showing the alkali-soluble property in the acid ambience with high photo stability into the resin, only acid generation reaction take place in the light exposure process, and alkali soluble reaction can take place only during the subsequent PEB process. Therefore, the parameter determining the pattern size is only the two mentioned above and no longer depends on the time from the light exposure to PEB. This means that it is a pattern forming method with high precision in dimension. As a result of various investigations on said functional group, the present inventors found that a tert-butoxy group is more preferable in the photostability and in bringing about the alkali-soluble reaction with high sensitivity in the acid atmosphere.

Other preferable examples of the functional group are methyl, isopropyl, tert-butyl, methoxymethyl, isopropoxymethyl, tetrahydropyranyl, tetrahydrofuranyl, trimethylsilyl, tert-butoxycarbonyl, isopropoxycarbonyl etc. Needless to say, any other groups can be used so long as they become alkali-soluble in the acid atmosphere. It is considered that the tert-butoxy group is the best in terms of the size stability as stated above. However, it is not limited to the above examples.

As to the photoacid generator (b), any photoacid generator can be used so long as they can generate an acid by exposure to light, such as nitrobenzyl compounds, onium salts, sulfonic acid compounds and carbonic acid compounds.

As to the solvent (c), any solvents can be used so long as they dissolve the resin and the acid generating The temperature of PEB is preferably from 90° C. to the glass transition temperature (Tg) of the resin. When the temperature is below 90° C., the photoacid generator does not function effectively to fail to obtain a good pattern with high sensitivity. On the other hand, when the temperature is higher than the Tg of the resin, the resin is softened to fail to obtain a good pattern.

As to the exposure light source, there can be used any ones which can cause generation of an acid by irradiation. Examples of the exposure light are g-line (436 nm), i-line (365 nm), electron beams, X-rays, etc.

This invention is illustrated by way of the following Examples, but not limited thereto.

EXAMPLE 1

A pattern forming material was prepared using the following ingredients:.

(1) 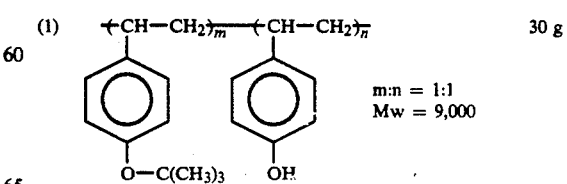 30 g (2) 2,6-dinitrobenzyl p-toluenesulfonate 1 g
(3) diethylene glycol dimethyl ether 70 g This is an example wherein in the resin (1), a tert-butoxy group is used as a functional group that shows an alkali-soluble property under an acid atmosphere, and hydroxystyrene is used as a moiety containing a hydrophilic property. Linkage of C—O in the tert-butoxy group is cut off under acid atmosphere as shown before, and as a result, a hydroxyl group is formed.

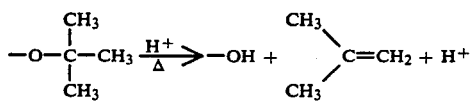

The compound (2) is used as a photoacid generator. The following reaction takes place by exposure to light:

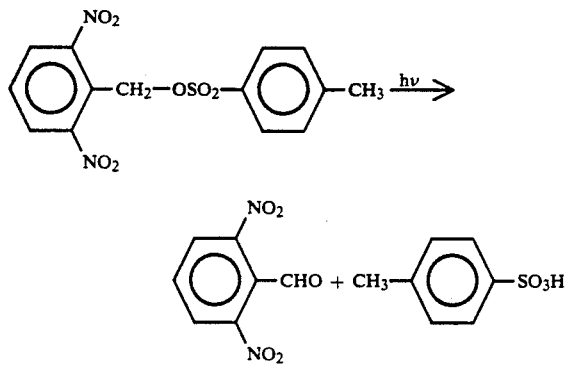

The compound (3) is an example of the solvent which can dissolve both (1) and (2) mentioned above. Since it has very high transmittance in the deep UV region, a good result is exhibited by the use of such a solvent for a pattern forming material for KrF excimer laser. The tert-butoxy group has only one weak linkage in the functional group. Moreover, this bonding is bigger is strength than usual t-BOC, and is

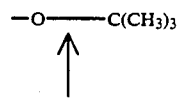

not easily cut off by the exposure to light. In short, the alkali-soluble reaction takes place only in the PEB process, so that changes in the pattern size are not produced.

Now, the pattern forming method is explained referring to FIG. 3(a) to 3(d). A 1.0 μm thick pattern forming material film is obtained by spin coating the pattern forming material 2 on a semiconductor substrate such as silicon 1 to produce a resist thin film, baking it at 90° C. for 90 sec. on a hot plate 3 and removing the solvent in the thin film by evaporation (FIG. 3(a)). The substrate 1 may have an insulation film, an electroconductive film or a semiconductor film on the surface thereof. Next, the photoacid generator (2) is subjected to photo decomposition as mentioned above by exposing to 248.4 nm KrF excimer laser 4 through a mask 5 (FIG. 3(b)). Then, the film is baked (PEB) at 130° C. for 90 sec. on the hot plate 3 to bring about the alkali-solubilizing reaction on the tert-butoxy group as stated before (FIG. 3(c)). Then, by developing it with an alkaline developer (2.38% tetramethylammonium hydroxide (TMAH)) for 60 sec., the exposed part 2b of the pattern forming material is removed through dissolution to obtain a positive type resist pattern 2a (FIG. 3(d)).

Thus, it becomes possible to form pattern 2a and fine pattern 2c of 1.0 μm or less by the above method without being peeled off from the substrate 1. Consequently, it is possible to perform accurate selective etching on the surface of the substrate 1 using this resist pattern 2a and 2c as a mask.

Figure 4:
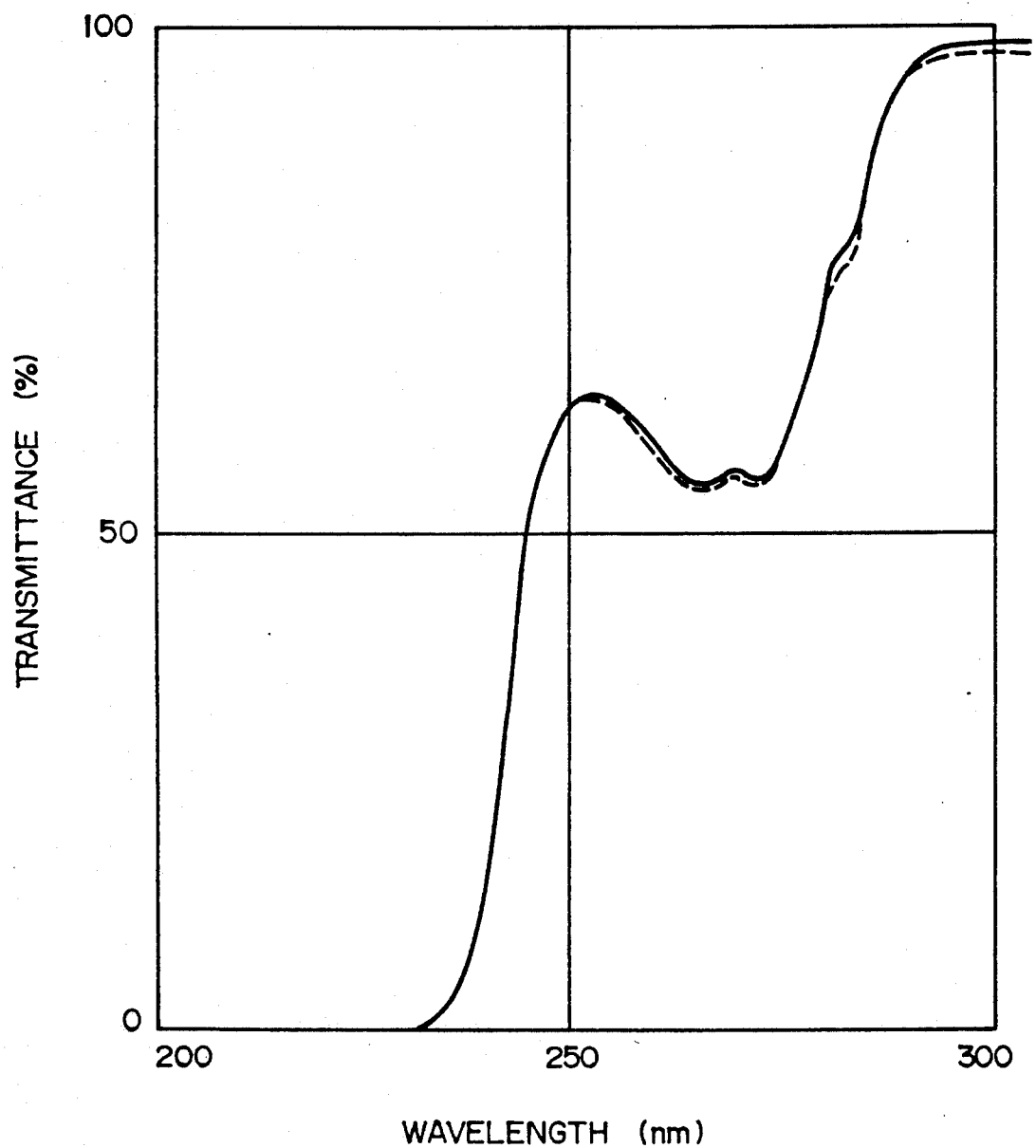
FIG. 4 is a UV spectral diffraction curve of a pattern forming material of Example 1 of this invention (the solid line means before exposure and the broken line means after exposure).
Figure 5:
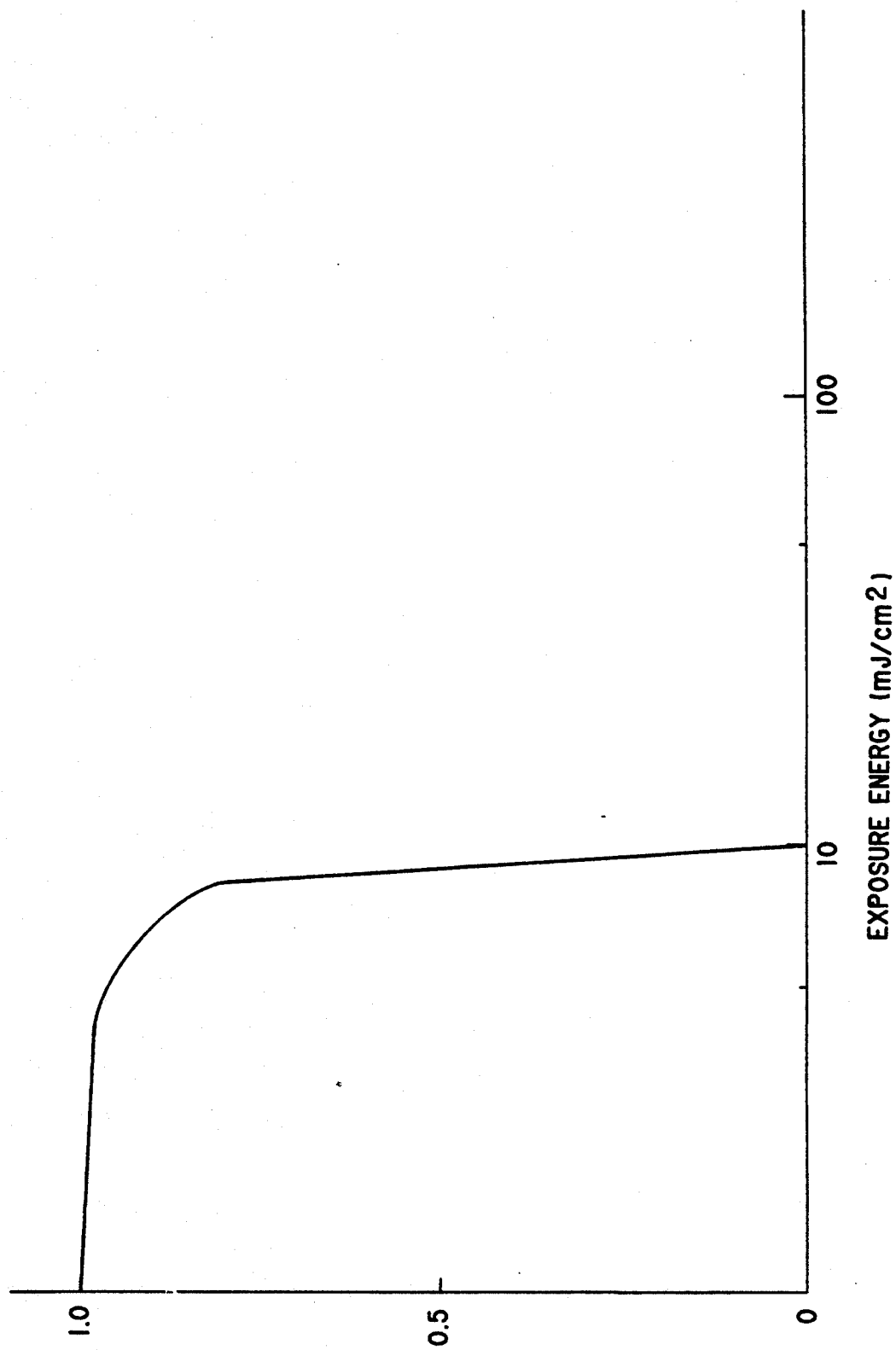
FIG. 5 shows irradiation characteristics of a pattern forming material of Example 1 of this invention.

UV spectral diffraction curve of the pattern forming material used in this invention (film thickness 1 μm) before and after the exposure are shown in FIG. 4. FIG. 4 shows high transmittance of approx. 65% with no changes before and after the exposure. As a result of the pattern forming experiment, it was possible to form a 0.3 μm line and space pattern which has a good shape as resist pattern 2a. Furthermore, irradiation characteristics of this pattern forming material (1 μm thick) are shown in FIG. 5, which shows high contrast and high sensitivity. The γ-value was 5.5 and the sensitivity was 10 mJ/cm$^2$. Here, resolution limit and pattern angles on the substrates using the pattern forming material of one example of this invention and prior art material are shown in the below Table.

TABLE

| Substrate | Pattern-forming method of this invention Resolution degree (μm)/ Pattern angle (°) | Prior art pattern forming method Resolution degree (μm)/ Pattern angle (°) |
|---|---|---|
| Silicon (μm/degree) | 0.3/90 | 1.0/90–85 |
| SiO$_2$ (μm/degree) | 0.3/90 | 2.0 or more/ 90–85 |
| Spin on glass (μm/degree) | 0.3/90 | 2.0 or more/ 90–85 |

According to the pattern forming method of this invention, super fine patterns which could not be formed by the prior art pattern forming method with chemical amplification type resist, are formed with good pattern angle and sensitivity. Also, according to the pattern forming method of this invention, patterns with a fine shape that is not peeled off even from SiO$_2$ or spin on glass (SOG) film which is conventionally known to have low adhesiveness, can be formed as well as on a silicon substrate.

Figure 6:
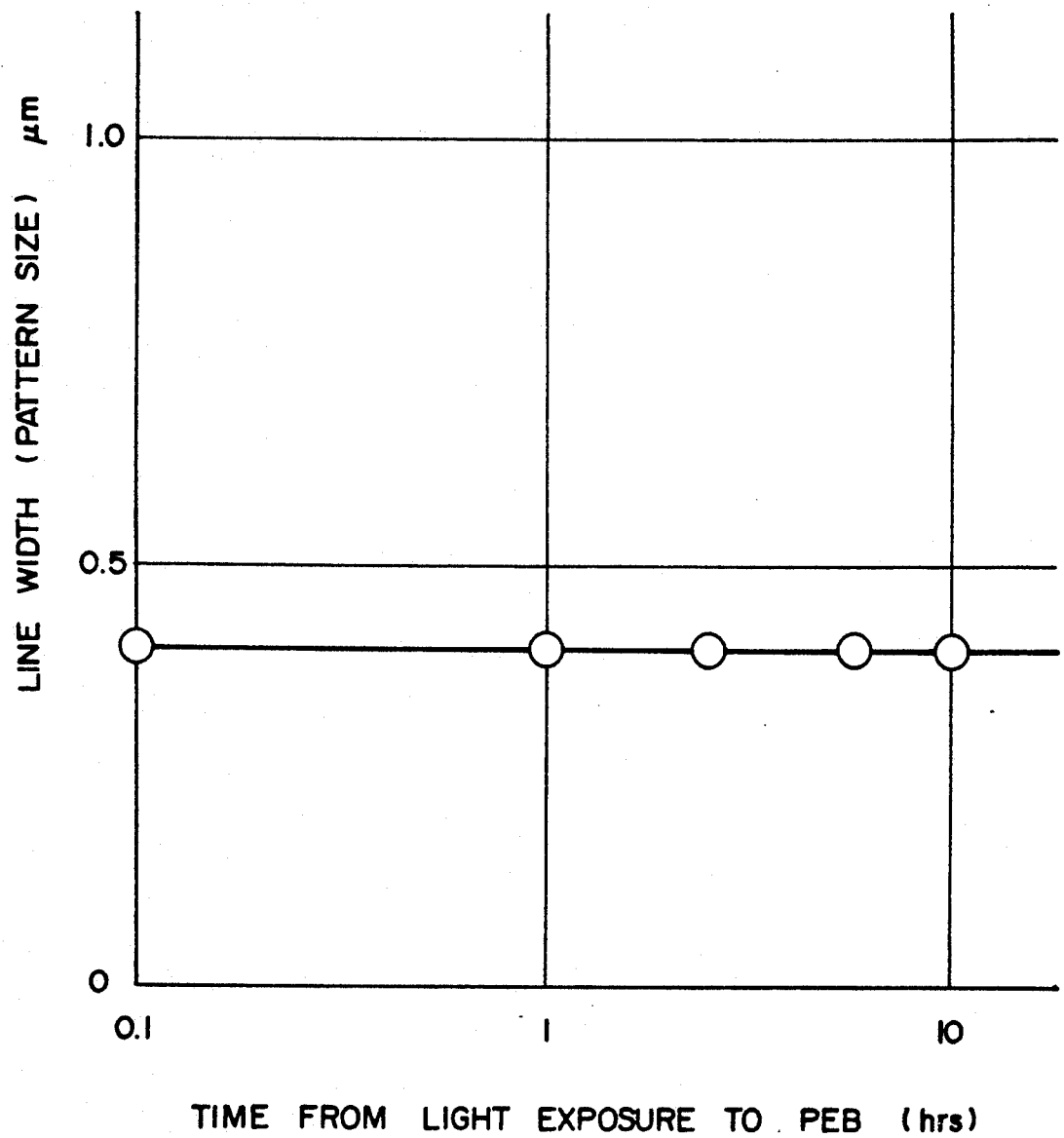
FIG. 6 is a line-width variation dependence on the time from the light exposure to PEB in the pattern forming method of this invention.

A pattern size relation with the time from the exposure to PEB by the pattern forming method of this invention is shown in FIG. 6. Changes in the pattern size are not observed after 10 hours. That is, the pattern forming method of this invention is significant in the production of a subhalf micron device because it is possible to form super fine patterns of 0.5 μm or less in a good shape as designed. As a result, it is possible to form a semiconductor device with designed characteristics and reliability with expectancy of high productivity.

EXAMPLE 2

The process of Example 1 was repeated except for using the following photoacid generator:

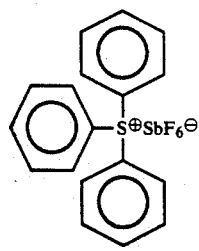

As a result, a good result of sensitivity of 5 mJ/cm² was obtained as in Example 1.

EXAMPLE 3

The process of Example 1 was repeated except for using the following photoacid generator:

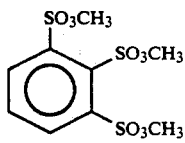

As a result, a good result of sensitivity of 15 mJ/cm² was obtained as in Example 1.

EXAMPLE 4

The process of Example 1 was repeated except for using the following resin:

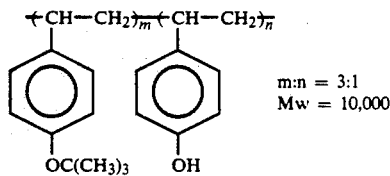

This resin introduces a group containing a hydrophilic property (a hydroxyl group) in less ratio than that of Example 1. As a result of the experiment, good adhesiveness was obtained by this resin as in Example 1.

EXAMPLE 5

The process of Example 1 was repeated except for using the following resin:

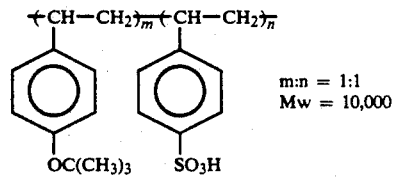

In this resin, a sulfonic acid group is introduced as a group containing a hydrophilic property. As a result of the experiment, a good result as in Example 1 was obtained.

As to the photoacid generator, any compounds having good solution stability and acid generating efficiency can be used. Preferable examples of the photoacid generators are as follows.

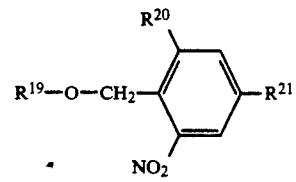

wherein $R^{19}$ is a trichloroacetyl group, a p-toluene-sulfonyl group, a p-trifluoromethylbenzenesulfonyl group, a methanesulfonyl group or a trifluoromethanesulfonyl group; and $R^{20}$ and $R^{21}$ are independently a hydrogen atom, a halogen atom or a nitro group.

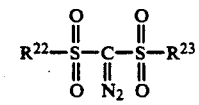

wherein $R^{22}$ and $R^{23}$ are independently a straight-chain, branched or cyclic alkyl group, a haloalkyl group or a group of the formula:

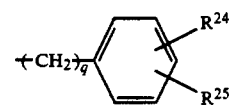

wherein q is zero or and integer of 1 or more; $R^{24}$ and $R^{25}$ are independently a hydrogen atom, a halogen atom, a straight-chain, branched or cyclic alkyl group, a haloalkyl group, an alkoxy group, a nitro group or a cyano group.

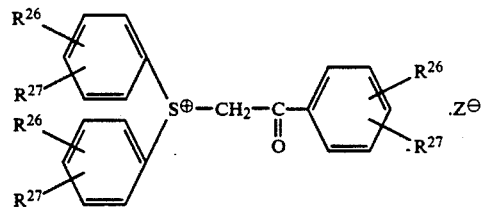

wherein $R^{26}$ and $R^{27}$ are independently a hydrogen atom, a halogen atom, a straight-chain, branched or cyclic alkyl group or an alkoxy group; and $Z^{\ominus}$ is a perchlorate ion, a toluenesulfonate ion, or a trifluoromethansulfonate ion.

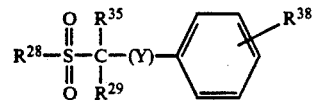

wherein Y is a carbonyl group, a sulfonyl group or a sulfinyl group; $R^{28}$ is a lower alkyl group, a trifluoromethyl group, a phenyl group or an alkyl-substituted phenyl group; $R^{29}$ and $R^{35}$ /and are independently a lower alkyl group, a halogen atom or a hydrogen atom; and $R^{38}$ is a hydrogen atom, a halogen atom, a lower alkyl group, an alkoxy group or an alkylthio group.

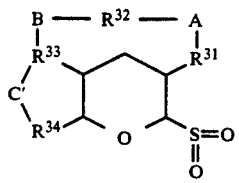

wherein $R^{31}$, $R^{32}$, $R^{33}$ and $R^{34}$ are independently a hydrogen atom, a halogen atom, a straight-chain, branched or cyclic alkyl group, a haloalkyl group, an alkoxy group, an aralkyl group, a substituted phenyl group, a phenyl group, a nitro group or a cyano group; and $R^{31}$-$R^{32}$, $R^{32}$-$R^{33}$ and $R^{33}$-$R^{34}$ independently form an aliphatic ring, a heteroaliphatic ring, an aromatic ring or a hetero aromatic ring via A, B and C', respectively, each having 5 to 8 carbon atoms.

As to the solvent, diethylene glycol dimethyl ether which shows low absorption in the deep ultraviolet light region is used in above Examples. But any solvents that can dissolve the resin and the acid generating agent can be used. Examples of the solvent are ethyl Cellosolve acetate, methyl Cellosolve acetate, ethyl lactate, methyl lactate, diethylene glycol monomethyl ether, diethylene glycol monobutyl ether, etc. but not limited thereto.

The temperature of PEB is preferably from 90° C. to the glass transition temperature (Tg) of the resin. When the temperature is below 90° C., the photoacid generator does not function effectively to fail to obtain a good pattern with high sensitivity. On the other hand, when the temperature is higher than the Tg of the resin, the resin is softened to fail to obtain a good pattern.

As to the exposure light source, those that generate an acid by the exposure can be used. Examples of the light source are g-line (436 mm), i-line (365 mm), electron beams, X-rays, etc.

What is claimed is:

1. A process for forming a pattern which comprises forming on a substrate a film of pattern forming material comprising:
   (a) a resin containing both hydrophilic groups and functional groups which are convertible to alkaline soluble groups by reaction with a photogenerated acid, which resin has a backbone of repeating ethylene units;
   (b) a photoacid generator being able to generate an acid by exposure to light, which is selected from the group consisting of compounds represented by the formulae:

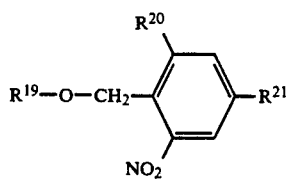

wherein $R^{19}$ is a trichloroacetyl group, a p-toluenesulfonyl group, a p-trifluoromethylbenzenesulfonyl group, a methanesulfonyl group or a trifluoromethanesulfonyl group; and $R^{20}$ and $R^{21}$ are independently a hydrogen atom, a halogen atom or a nitro group;

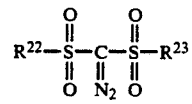

wherein $R^{22}$ and $R^{23}$ are independently an unsubstituted straight-chain, branched or cyclic alkyl group, a haloalkyl group, or a group of the formula:

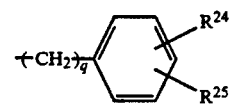

wherein q is zero or an integer of 1 or more; $R^{24}$ and $R^{25}$ are independently a hydrogen atom, a halogen atom, an unsubstituted straight-chain, branched or cyclic alkyl group, a haloalkyl group, an alkoxy group, a nitro group or a cyano group;

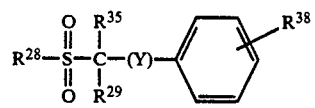

wherein Y is a carbonyl group, a sulfonyl group or a sulfinyl group; $R^{28}$ is a lower alkyl group, a trifluoromethyl group, an unsubstituted phenyl group or an alkyl-substituted phenyl group; $R^{29}$ and $R^{35}$ are independently a lower alkyl group, a halogen atom or a hydrogen atom; and $R^{38}$ is a hydrogen atom, a halogen atom, a lower alkyl group, an alkoxy group or an alkylthio group; and

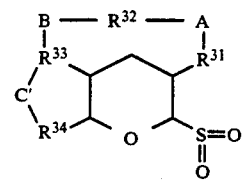

wherein $R^{31}$, $R^{32}$, $R^{33}$ and $R^{34}$ are independently an unsubstituted straight-chain, branched or cyclic alkyl group, a haloalkyl group, an alkoxy group, a substituted phenyl group, an unsubstituted phenyl group, a nitro group or a cyano group; and $R^{31}$-$R^{32}$, $R^{32}$-$R^{33}$ and $R^{33}$-$R^{34}$ independently form respectively an aliphatic ring, a heteroaliphatic ring, an aromatic ring or a hetero aromatic ring via A, B, and $C^1$, respectively, wherein each of said A, B and $C^1$ respectively comprises 5 to 8 carbon atoms, and (c) a solvent for dissolving both the components (a) and (b), exposing the film selectively to deep ultraviolet light, heating the exposed film, and
developing the resulting film to form the desired pattern.

2. A process according to claim 1, wherein the hydrophilic group is a hydroxyl group $Y_1$, a carboxyl group, a 2-hydroxycarbonyl group, a sulfonic acid group, or a group of the formula:

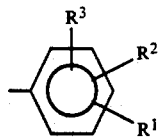

wherein $R^1$ is a hydroxy group, a carboxyl group, a 2-hydroxyethoxycarbonyl group or a sulfonic acid group; and $R^2$ and $R^3$ are independently a hydrogen atom, a halogen atom, or a lower alkyl group.

3. A process according to claim 1, wherein the functional group x is a methyl group, an isopropyl group, a tert-butyl group, a methoxymethyl group, an isopropoxymethyl group, a tetrahydropyranyl group, a trimethylsilyl group, a tert-butoxycarbonyl group or an isopropoxycarbonyl group.

4. A process according to claim 1, wherein the functional group is a butoxy group.

5. A process according to claim 1, wherein the resin (a) has repeating units of the formula:

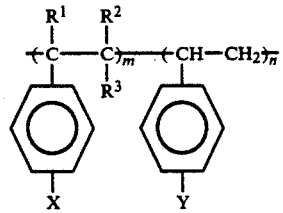

wherein X is a functional group; $R^1$, $R^2$ and $R^3$ are hydrogen atoms; $Y^1$ is OH or $SO_3H$; and m and n are independently an integer indicating the molar ratio of the monomer units.

6. A process according to claim 5, wherein X is $OC(CH_3)_3$.

* * * * *